United States Patent [19]
Morley et al.

[11] Patent Number: 4,979,074
[45] Date of Patent: Dec. 18, 1990

[54] PRINTED CIRCUIT BOARD HEAT SINK

[75] Inventors: Richard E. Morley; David A. Baker, both of Mason, N.H.

[73] Assignee: Flavors Technology, Amherst, N.H.

[21] Appl. No.: 364,892

[22] Filed: Jun. 12, 1989

[51] Int. Cl.⁵ ............................................. H05K 7/20
[52] U.S. Cl. .................................... 361/386; 165/185; 174/252; 361/387
[58] Field of Search ...................... 357/81; 174/252 X; 165/80.3, 185 X; 361/382, 383, 386, 387 X, 388 X

[56] References Cited

U.S. PATENT DOCUMENTS

| | | | |
|---|---|---|---|
| 3,689,804 | 9/1972 | Ishihama | 361/386 |
| 3,764,856 | 10/1973 | Martin | 361/387 |
| 4,363,076 | 12/1982 | McIver | 361/386 |
| 4,621,304 | 11/1986 | Oogaki | 361/386 |
| 4,654,754 | 3/1987 | Daszkowski | 361/388 |

Primary Examiner—Gerald P. Tolin
Attorney, Agent, or Firm—Weingarten, Schurgin, Gagnebin & Hayes

[57] ABSTRACT

A heat sink for a printed circuit board in comprised of a thermally-conductive plate having on one surface a thermally-conductive, electrically-insulative elastomer layer which conformally engages at leasts a portion of the back surface of the printed circuit board. The ends of pins of electronic components mounted on the board and desired to be cooled embed into the elastomer layer to provide a conductive path for transfer of heat from the electronic components to the elastomer layer and then to the thermally-conductive plate.

8 Claims, 2 Drawing Sheets 4,979,074

PRINTED CIRCUIT BOARD HEAT SINK

FIELD OF THE INVENTION

This invention generally relates to heat sinks for cooling electronic circuits and more particularly to a heat sink for cooling a printed circuit board.

BACKGROUND OF THE INVENTION

On densely packed printed circuit boards, a means for transferring heat away from electronic components is needed. The traditional means for cooling electronic components such as integrated circuit packages is to use convection air currents to carry off the excess heat. Typically, fins are either integrally formed as part of the component package or are separately attached to the component package. The fins increase the surface area of the component package to improve transfer of excess heat to convection air currents. Cooling is further improved by the use of a fan to increase the volume of air available for cooling.

It has usually been assumed that to cool an electronic component, the majority of heat produced by the component must be radiated to convection air from the surface of the component package. Therefore, most attempts to improve the cooling of electronic components have focused on improving the transfer of excess heat from the package to convection air currents.

As is known, however, many electronic components, such as integrated circuit packages, have pins which attach the components to a printed circuit board The board separates and supports the components and connects the components to form an electronic circuit. The pins of the components pass through the printed circuit board and are soldered to the board on the back side of the board opposite to the mounted components. Although the pins are a thermally-conductive path from the heat-producing parts of the component, transfer of heat from the component through the pins to convection air is normally inefficient because of the small surface area of the pins exposed to convection air.

SUMMARY OF THE INVENTION

In brief, a heat sink is provided which cools electronic components from the back surface of a printed circuit board and greatly improves transfer of heat from electronic components through the pins of the components. The heat sink is comprised of a thermally-conductive plate which attaches to a layer of heat-conducting, electrically-insulative elastomeric material. The elastomeric material conformally attaches to the back surface of the printed circuit board so that the material is sandwiched between the printed circuit board and the plate. The soldered component pins, which normally protrude from the back surface of the printed circuit board, embed into the material. In use, the elastomeric material provides excellent thermal contact and thermal conduction from the soldered pins to the thermally-conductive plate. The elastomeric material can be disposed at the circuit board sites of heat generating components or over the entire circuit board back surface.

One advantage of the present invention is that special hardware, such as fins, need not be integrally formed or separately attached to the individual packages of heat sensitive electronic components. Because this special hardware, which increases the size and weight of heat sensitive components, is not needed, printed circuit boards employing the present invention can be more densely packed than previously possible without affecting heat transfer away from the heat sensitive components.

Furthermore, when the present invention is used with an electronic circuit having components operating at different temperatures, the present invention has the additional advantage of transferring excess heat from the pins of hotter electronic components to cooler electronic components. Thus, the circuit can operate at a very much higher ambient temperature than without the present invention because the average temperature of the entire circuit is increased and the peak temperature caused by the critical hotter electronic components is reduced. More heat flow from the circuit can therefore occur.

DESCRIPTION OF THE DRAWINGS

The invention will be more fully understood from the following detailed description provided in conjunction with the accompanying drawings, in which.

DETAILED DESCRIPTION OF THE INVENTION

Figure 1:
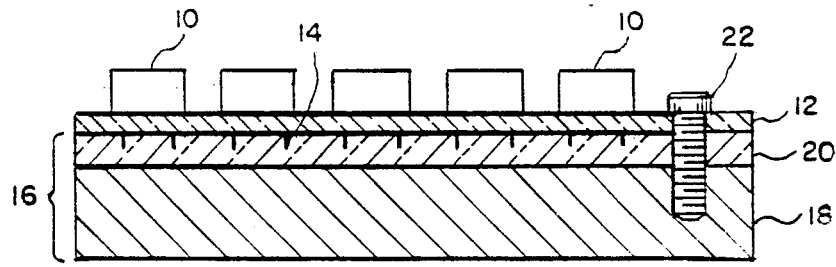
FIG. 1 is a cross-section view of the present invention.
Figure 2:
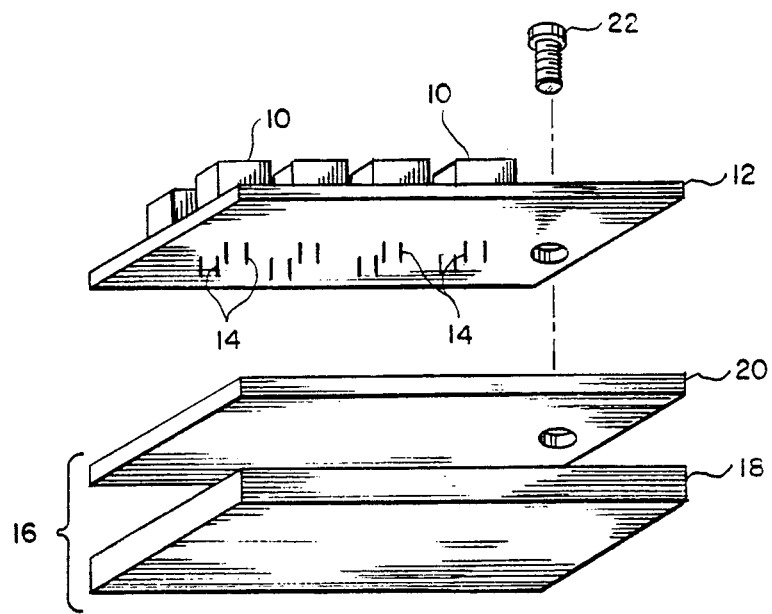
FIG. 2 is an exploded perspective view of the embodiment of the present invention shown in FIG. 1.

Referring to the drawings, particularly FIGS. 1 and 2, wherein like reference numerals designate corresponding or similar elements throughout the several views, electronic components 10 are disposed on a printed circuit board 12 such that the pins 14 of electronic components 10 extend through printed circuit board 12 and protrude, typically about 1/32 inch from the back side of the printed circuit board. Pins 14 are soldered to conductive pads on the printed circuit board 12 in a well known manner.

A heat sink 16 is comprised of a thermally-conductive plate 18 attached to a thermally-conductive, electrically-insulative elastomer layer 20. Heat sink 16 is conformally attached, such as by thru-bolts 22 or otherwise, to the back surface of printed circuit board 12 such that elastomer layer 20 is sandwiched between thermally-conductive plate 18 and printed circuit board 12, and such that pins 14 and any other irregularities on the back surface of printed circuit board 12 are embedded into elastomer layer 20.

Thermally-conductive plate 18, which typically is made of aluminum, can be of any desired size to provide the intended cooling. The plate 18 can be coextensive with the circuit board, or can be larger than the printed circuit board to cool power supply components or other printed circuit boards or to provide an area for increased exposure to convection cooling air. Alternatively, plate 18 can be smaller than board 12 to redistribute heat among only a limited number of components. For example, a 6×6 inch square plate can be attached to a larger printed circuit board to redistribute heat from a single $\frac{1}{2} \times \frac{1}{2}$ inch component.

The thermally-conductive elastomer layer 20 can be molded to the thermally-conductive plate 18 or can be separately provided as a pre-molded sheet. Thru-bolts 22 compress the elastomer layer 20 between the plate 18 and the printed circuit board 12. The elastomer is typically silicone rubber loaded with alumina or boron nitride, and has a typical thickness of 1/16 inch.

Figure 3:
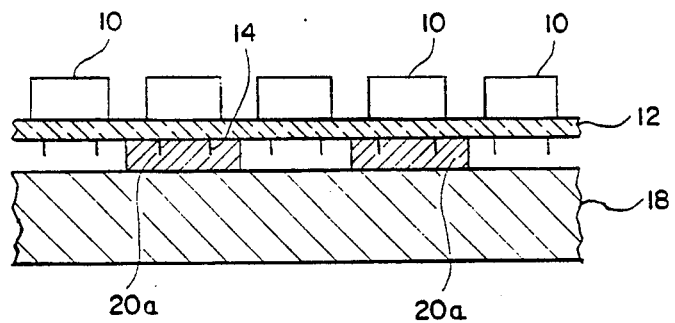
FIG. 3 is a cross-section view of an alternative embodiment of the invention.

In the embodiment described above, the elastomeric material 20 is disposed substantially over the entire back surface of circuit board 12. Alternatively, the elastomeric material can be provided only at the sites of the heat generating components or of those components which are to be cooled. In this instance, as shown in FIG. 3, the elastomer 20a is of a size and configuration to engage the pins of the component or components to be cooled. The thermally-conductive plate 18 is placed in contact with the one or more elastomeric sheets. Or, a separate thermally-conductive plate can be employed with each elastomeric sheet.

The cooling of plate 18 can be increased beyond that provided by normal radiation by causing air flow across the outer surface of the plate, as indicated by arrow 30 in FIG. 1. Other means of enhanced cooling of plate 18 can be provided, such as attaching the plate to a water cooled, hydrocarbon-cooled or otherwise cold plate or structure. Channels can also be provided in plate 18 for coolant flow to enhance the cooling.

The present invention improves heat transfer in electronic circuits employing components having different operating temperatures because the peak temperatures of the hottest most critical components are reduced and the average temperature of the entire circuit is increased. Therefore, more heat flow from the circuit than otherwise possible can occur.

Figure 4:
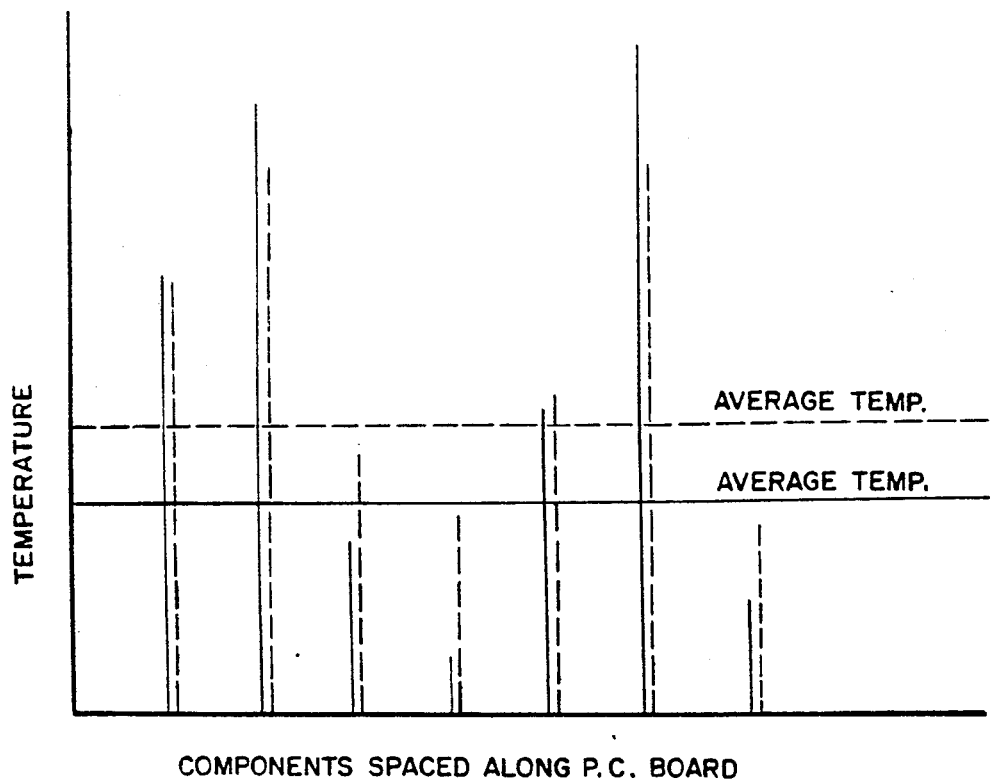
FIG. 4 is a graph demonstrating how use of the present invention increases the average temperature of an electronic circuit employing components operating at different temperatures yet permits operation of the circuit at the higher average temperature.

As shown in FIG. 4, the present invention permits transfer of the peak temperatures of the highest temperature components to other electronic components. Some components (the coolest ones) actually increase in temperature. Although the average temperature of the entire circuit increases, the temperatures of the hottest, most critical components decrease, which allows the entire circuit to operate at a very much higher ambient temperature than possible without the present invention. In most cases, the high temperature components of an electronic circuit do not outnumber the low temperature components; therefore, the decrease in temperature of the high temperature components can be significant. Because the average temperature of the circuit increases, the ability to conduct heat away from the board also increases. This means that less convection cooling air is needed to flow over the packages of the electronic components to cool the circuit than is needed without the present invention.

This detailed description discloses the presently preferred embodiment of the invention. A variety of modifications and variations of the present invention are possible in light of the above teachings. Therefore, the present invention should not be considered to be limited by what has been described above and is only limited by the following claims.

What is claimed is:

1. A heat sink for cooling an electronic circuit formed of at least one electronic component having pins which attach the at least one electronic component to a printed circuit board and which protrude a short predetermined distance from the back surface of the board, comprising:
    a thermally-conductive plate having a firs planar surface;
    a layer of a thermally-conductive, electrically-insulative elastomer disposed on the first planar surface of the plate, said layer of elastomer having a predetermined thickness greater than the short predetermined distance that the pins protrude from the back surface of the board; and
    means disposed in combination with the plate and layer of elastomer for attaching the plate and the layer of elastomer to the back surface of the printed circuit board with the protruding portions of the pins of that at least one electronic component embedded totally within said elastomeric layer to provide a thermally-conductive path from the at least one component to said layer of elastomer for cooling the at least one electronic component, and wherein said layer of elastomer is sandwiched between the back surface of the printed circuit board and the first planar surface of the plate and conformally engages the back surface of the printed circuit board.

2. The apparatus of claim 1, wherein the area of the first planar surface of the thermally-conductive plate is substantially the same as that of the printed circuit board.

3. The apparatus of claim 1, wherein the thermally-conductive plate is aluminum, and the elastomer is silicone rubber.

4. The heat sink of claim 1 wherein the electronic circuit is formed of a plurality of electronic components and wherein said layer of thermally-conductive, electrically-insulative elastomer comprises individual elastomeric sheets having a size and configuration for embedding the protruding portions of the pins of respective ones of the plurality of electronic components to provide individual thermally-conductive paths from each of the plurality of electronic components to said respective elastomeric sheet for cooling the plurality of electronic components.

5. The heat sink of claim 4 wherein said thermally-conductive plate comprises a plurality of individual thermally-conductive plates wherein each of said plurality of individual thermally-conductive plates has a respective one of said individual elastomeric sheets disposed on said first planar surface thereof.

6. For use in a circuit board having one or more heat-generating electronic components mounted on one surface thereof, the components having pins which attach the one or more heat-generating electronic components to the circuit board and which protrude a short predetermined distance from the back surface of the circuit board, a heat sink for the circuit board, comprising:
    a thermally-conductive, electrically-insulative elastomer disposed on the back surface of the circuit board and having a predetermined thickness greater than the short predetermined distance that the pins protrude from the back surface of the circuit board wherein the protruding portion of the pins of at least one electronic component are embedded totally within said elastomer to provide a thermally-conductive path from the one or more heat-generating components to said elastomer for cooling the one or more heat-generating components;
    a thermally-conductive plate disposed on the elastomer; and
    means for securing the circuit board, said elastomer and said thermally-conductive plate together.

7. The heat sink of claim 6 wherein said thermally-conductive, electrically-insulative elastomer comprises individual elastomeric sheets having a size and configuration for embedding the protruding portions of the pins of respective ones of the one or more heat-generating components to provide individual thermally-conductive paths from each of the one or more heat-generating components to said respective elastomeric sheet for cooling the one or more heat-generating components.

8. The heat sink of claim 7 wherein said thermally-conductive plate comprises a plurality of individual thermally-conductive plates wherein each said individual elastomeric sheet has a respective one of said individual thermally-conductive plates disposed thereon.

* * * * *

UNITED STATES PATENT AND TRADEMARK OFFICE
CERTIFICATE OF CORRECTION

PATENT NO.   :  4,979,074
DATED        :  December 18, 1990
INVENTOR(S)  :  Richard E. Morley, et al.

It is certified that error appears in the above-identified patent and that said Letters Patent is hereby corrected as shown below:

In the Abstract, in the first line, "board in comprised" should read --board is comprised--.

Column 1, line 31, "circuit board The" should read --circuit board. The--.

Column 1, line 49, "of heat" should read --of a heat--.

Column 3, line 67, "firs" should read --first--.

Column 4, line 11, "that" should read --the--.

Signed and Sealed this

Fifteenth Day of September, 1992

Attest:

DOUGLAS B. COMER

*Attesting Officer*          *Acting Commissioner of Patents and Trademarks*